(12) United States Patent
Kim

(10) Patent No.: US 9,214,917 B2
(45) Date of Patent: Dec. 15, 2015

(54) STACK TYPE COMMON MODE FILTER FOR HIGH FREQUENCY

(71) Applicant: JOINSET CO., LTD., Ansan-si, Kyeonggi-do (KR)

(72) Inventor: Sun-Ki Kim, Gunpo-si (KR)

(73) Assignees: Joinset Co., Ltd., Ansan-si (KR); Sun-Ki Kim, Kyeonggi-do (KR)

( * ) Notice: Subject to any disclaimer, the term of this patent is extended or adjusted under 35 U.S.C. 154(b) by 64 days.

(21) Appl. No.: 14/191,618

(22) Filed: Feb. 27, 2014

(65) Prior Publication Data

US 2015/0145616 A1    May 28, 2015

(30) Foreign Application Priority Data

Nov. 28, 2013  (KR) .................. 10-2013-0146655

(51) Int. Cl.
| | | |
|---|---|---|
| *H03H 7/00* | (2006.01) | |
| *H03H 7/09* | (2006.01) | |
| *H03H 7/42* | (2006.01) | |
| *H03H 1/00* | (2006.01) | |

(52) U.S. Cl.
CPC ............... *H03H 7/09* (2013.01); *H03H 7/427* (2013.01); *H03H 2001/0078* (2013.01); *H03H 2001/0085* (2013.01)

(58) Field of Classification Search
CPC . H03H 7/09; H03H 7/427; H03H 2001/0078; H03H 2001/0085
USPC ........................................................... 333/185
See application file for complete search history.

(56) References Cited

U.S. PATENT DOCUMENTS 4,547,961 A * 10/1985 Bokil et al. ................. 29/602.1
2014/0225699 A1 * 8/2014 Sekiguchi et al. ............ 336/192

FOREIGN PATENT DOCUMENTS

| JP | 11097256 A | * | 4/1999 |
| JP | 2002057033 A | * | 2/2002 |

* cited by examiner

*Primary Examiner* — Robert Pascal
*Assistant Examiner* — Kimberly Glenn
(74) *Attorney, Agent, or Firm* — Park & Associates IP Law, P.C.

(57) ABSTRACT

A stack type common mode filter (CMF) for high frequency may improve high frequency characteristics, like removing an impedance difference between terminals by not overlapping terminal portions of multiple stack structures with upper and lower magnetic substances, and removing noise in a common mode and removing a signal distortion in a differential mode by removing an unnecessary parasitic impedance from terminal portions, and thus the stack type CMF for high frequency may be applicable at a high frequency compared to a conventional CMF.

13 Claims, 9 Drawing Sheets

Table 1  Computer digital interface  ( ) shows basic frequency

| Applied interface | DisplayPort | LVDS | DVI | HDMI | USB2.0 HS | USB3.0 SS |
|---|---|---|---|---|---|---|
| Bit rate (Frequency) | 2.7Gbps (1.35GHz) | (1.0GHz and lower) | 1.65Gbps (825MHz) | 3.4Gbps (1.7GHz) | 480Mbps (240MHz) | 5.0Gbps (2.5GHz) |
| Differential pair | 4-pair | 14-pair | 4-pair | 4-pair | 1-pair | 3-pair include HS |
| AC-coupling | Yes | None | None | None | None | Yes |
| Audio support | Yes | None | None | Yes | None | None |

FIG. 3
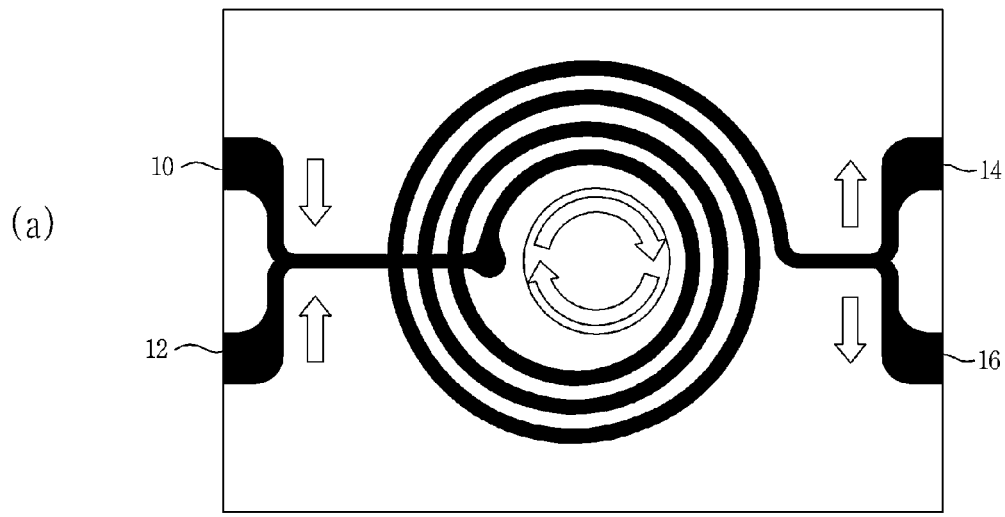
(a)
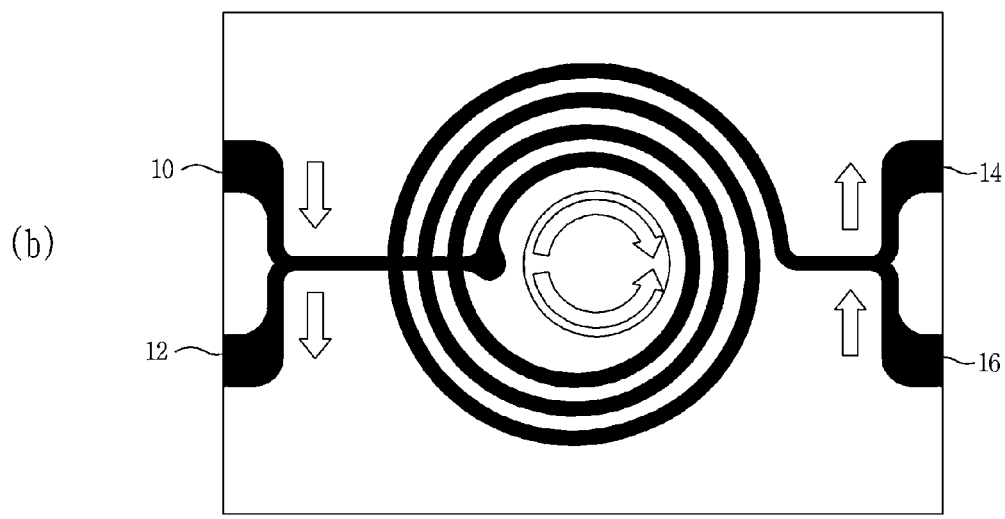
(b)

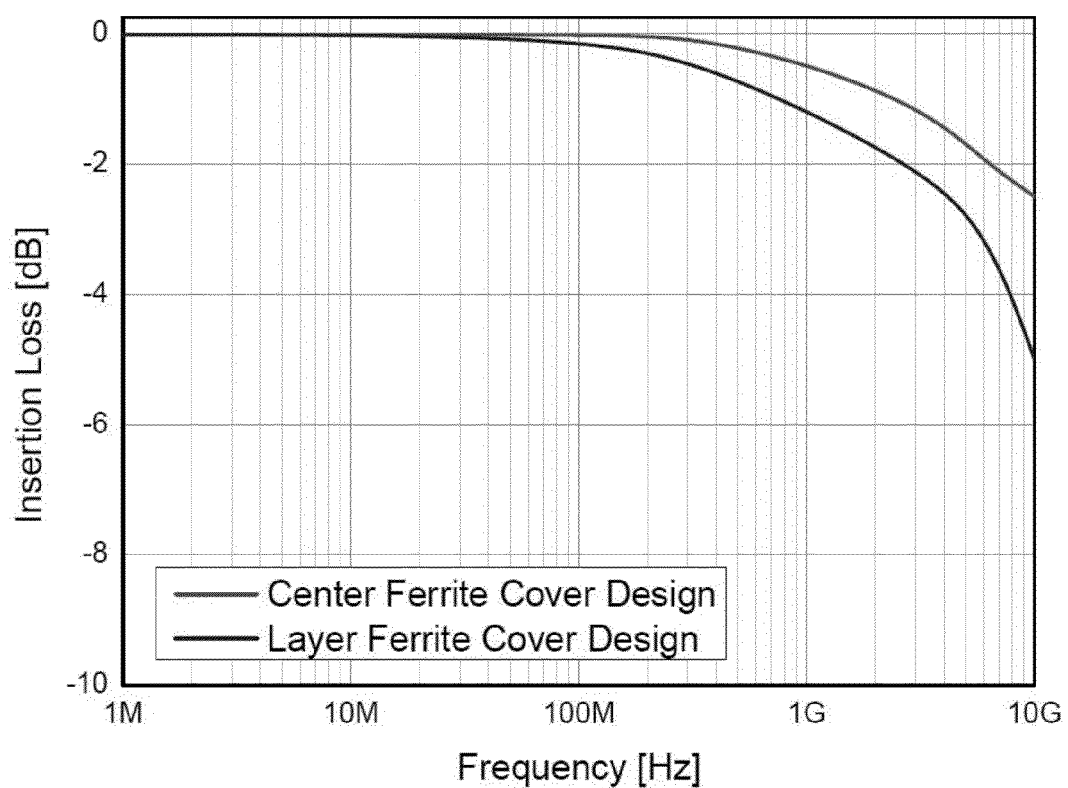

STACK TYPE COMMON MODE FILTER FOR HIGH FREQUENCY

REFERENCE TO RELATED APPLICATIONS

This application claims the priority benefit of Korean Patent Application No. 10-2013-0146655 filed on Nov. 28, 2013, the entire contents of which are incorporated herein by reference.

FIELD OF THE INVENTION

The present invention relates to a stack type common mode filter (CMF) for high frequency, and more particularly, to a stack type CMF applicable at a ultra high frequency by removing an impedance difference between terminals or removing unnecessary parasitic impedance.

BACKGROUND OF THE INVENTION

Electronic products have recently dealt with an enormous amount of data according to the market demand.

Although only singles were transmitted in the past, a large amount of data may be very quickly transmitted by using differential signals at present.

A computer, an example of such a digital electronic product, has dealt with high resolution images or moving images and thus requiring a signal transmission system faster than other ones.

This is a background of commercializing a common mode filter (CMF) for a fast signal transmission, such as a display port.

FIG. 1 is a table of effective frequencies for respective signal transmission circuits. A universal serial bus (USB) 3.0 super speed (SS) uses an ultra high frequency band of 2.5 GHz and thus requiring a CMF capable of high frequency transmission. As a result, it was important as to where an element for limiting a cut-off frequency is disposed in the CMF.

In general, the CMF is configured to, as shown in FIG. 2, allow two coils to turn in the same direction with respect to a center magnetic path (a magnetic core) and extend to be coupled to terminal portions formed at both edges.

As shown in FIG. 3A, since signals flow in two coils in the same turn direction by signals applied from a terminal portion formed at one side in a common mode, impedance components are summed with respect to a magnetic core, and thus a high impedance component is formed.

As shown in FIG. 3B, since signals flow in two coils in different turn direction by signals applied from terminal portions formed at both sides in a differential mode, impedance components are offset with respect to a magnetic core. In other words, coils that turn with respect to a center magnetic core are formed at different phases, and thus the coils function to offset a magnetic flux, and directions having the same phase are formed in terminal portions, and thus an opposite characteristic to that of the common mode exhibits.

In such a conventional structure, it is very important to increase an electromagnetic degree of coupling between a primary coil and a secondary coil so as to enhance an electric characteristic, and an interval between the two coils needs to be reduced or a magnetic path needs to be formed not to generate a leakage magnetic flux so as to increase the electromagnetic degree of coupling between the primary coil and the secondary coil.

However, terminal portions for mounting lean to edges as surface mounting portions, and thus the conventional structure is to be a structure in which a matching relation between coils is not established.

Referring to FIG. 2, when the terminal portions are formed at edges, one of the terminal portions may have 0.5 turn more or less than the other one in a center magnetic core structure, which causes a distance difference between the terminal portions, and thus impedance between terminals of the two coils may not be structurally the same.

As a result, an impedance difference between terminals occurs in the common mode of FIG. 3A, and an unnecessary impedance (parasitic impedance) component is generated in the differential mode of FIG. 3B.

Accordingly, although manufactures compensate for coil turns between coils by using diverse methods, they fail to establish a perfect matching relation.

SUMMARY OF THE INVENTION

An object of the present invention is to provide a stack type common mode filter (CMF) for high frequency that may remove an impedance difference between terminals in a common mode.

Another object of the present invention is to provide a stack type CMF applicable at a high frequency compared to a conventional CMF by removing an unnecessary impedance component in a differential mode.

According to an aspect of the present invention, there is provided a stack type common mode filter (CMF) for high frequency including a main body including an upper magnetic substance, a lower magnetic substance, and a stack structure disposed between the upper magnetic substance and the lower magnetic substance, and external electrodes formed on side surfaces of the main body, wherein the stack structure is formed by stacking a pair of unit stack structures of a first non-magnetic substance in which coil elements and leads electrically connecting the coil elements to the external electrodes are formed and a second non-magnetic substance on which only leads electrically connected to the external electrodes are formed and electrically connected to the first non-magnetic substance, and wherein terminal portions formed in outer ends of the leads do not overlap with the upper magnetic substance and the lower magnetic substance.

A terminal portion of one of the unit stack structures may be formed to be bent from the leads, another terminal portion may be formed to straightly extend from the leads, and terminal portions of the unit stack structures may be formed to be bent from the leads in opposite directions.

The both edges of the upper and lower magnetic substances may be positioned to be offset inwardly compared to both edges of the first and the second non-magnetic substances, thereby the terminal portions may not overlap with the upper magnetic substance and the lower magnetic substance.

The terminal portions may not overlap with the upper magnetic substance and the lower magnetic substance by forming grooves through which the terminal portions are exposed at edges of the upper magnetic substance and the lower magnetic substance, which respectively correspond to the terminal portions.

The first non-magnetic substance and the second non-magnetic substance may be electrically connected to each other through a via hole.

The stack type CMF for high frequency may remove noise in a common mode and remove a signal distortion in a differential mode.

The stack type CMF for high frequency may be applicable at a high frequency of 3 GHz or higher by forming a high cut-off frequency.

The coil elements and the leads may be formed on a green sheet.

Grooves to be filled may be formed from a top surface to a bottom surface of the main body to pass through the terminal portions of the stack structure, be filled with a silver (Ag) paste, and the main body and the stack structure are vertically cut so that the grooves are vertically cut by half, and thus the external electrodes may be formed in the silver paste exposed to the outside.

The external electrodes may extend to be bent to the top surface of the main body in the middle of a height direction of side surfaces of the main body.

According to another aspect of the present invention, there is provided a stack type CMF for high frequency including a main body including an upper magnetic substance, a lower magnetic substance, and a stack structure disposed between the upper magnetic substance and the lower magnetic substance, and external electrodes formed on side surfaces of the main body, wherein the stack structure is formed by stacking a pair of non-magnetic substances including coil elements and first leads electrically connecting the coil elements to the external electrodes in one surface and second leads electrically connected to the first leads and electrically connected to the external electrodes in another surface, and wherein terminal portions formed in outer ends of the first leads and the second leads do not overlap with the upper magnetic substance and the lower magnetic substance.

The coil elements and the first leads and the second leads may be formed as thin films on a polyimide film.

BRIEF DESCRIPTION OF THE DRAWINGS

The above objects and other advantages of the present invention will become more apparent by describing in detail exemplary embodiments thereof with reference to the attached drawings in which:

FIGS. 3A and 3B are diagrams of a common mode and a differential mode, respectively, of the conventional CMF;

FIG. 8 is a graph of a frequency characteristic of the stack type CMF for high frequency according to an embodiment of the present invention;

DETAILED DESCRIPTION OF THE INVENTION

Now, exemplary embodiments of the present invention will be described in detail with reference to the accompanying drawings.

Figure 4:
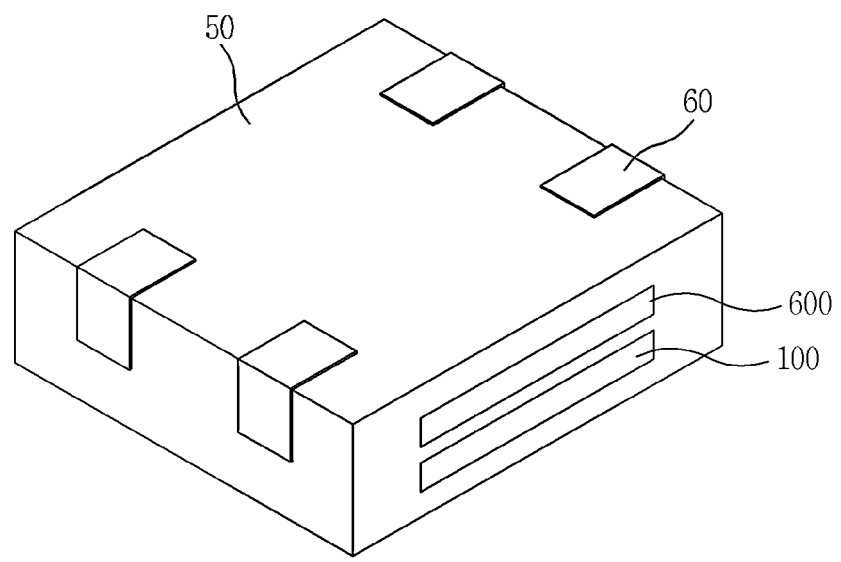
FIG. 4 is a perspective view of an appearance of a stack type CMF for high frequency according to an embodiment of the present invention.
Figure 5:
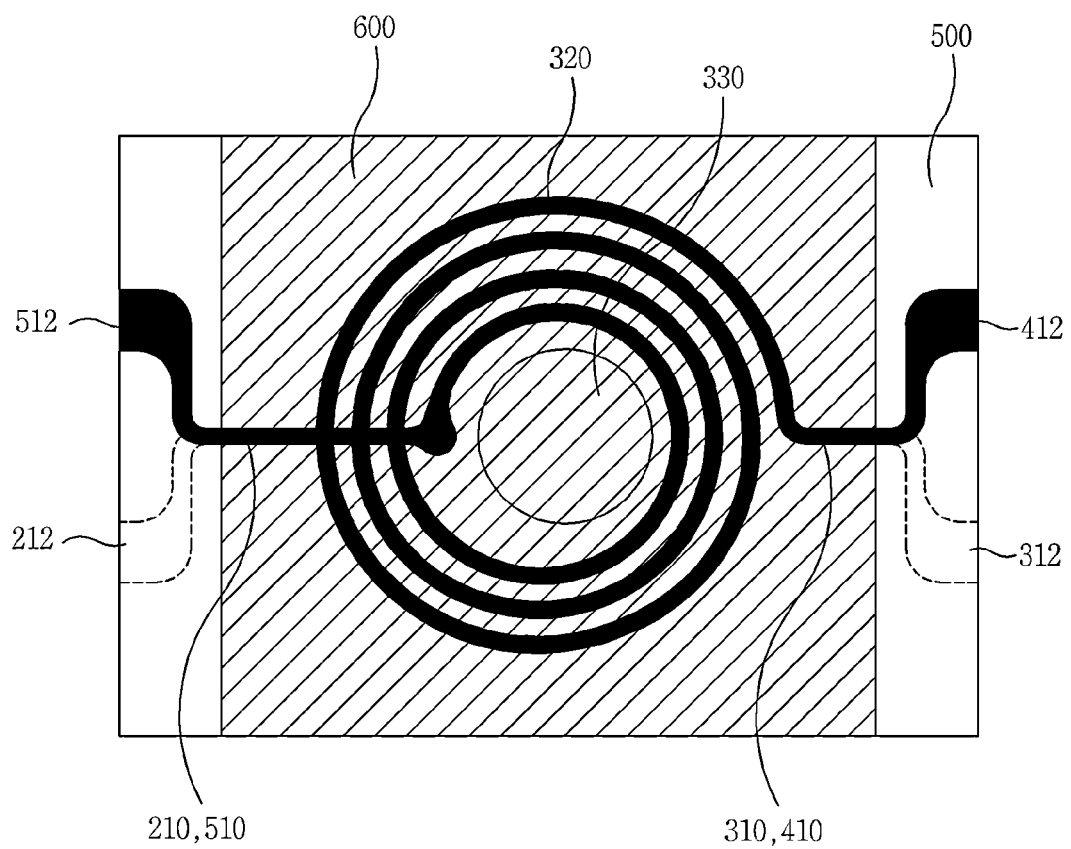
FIG. 5 is a plan view of the stack type CMF for high frequency according to an embodiment of the present invention.
Figure 6:
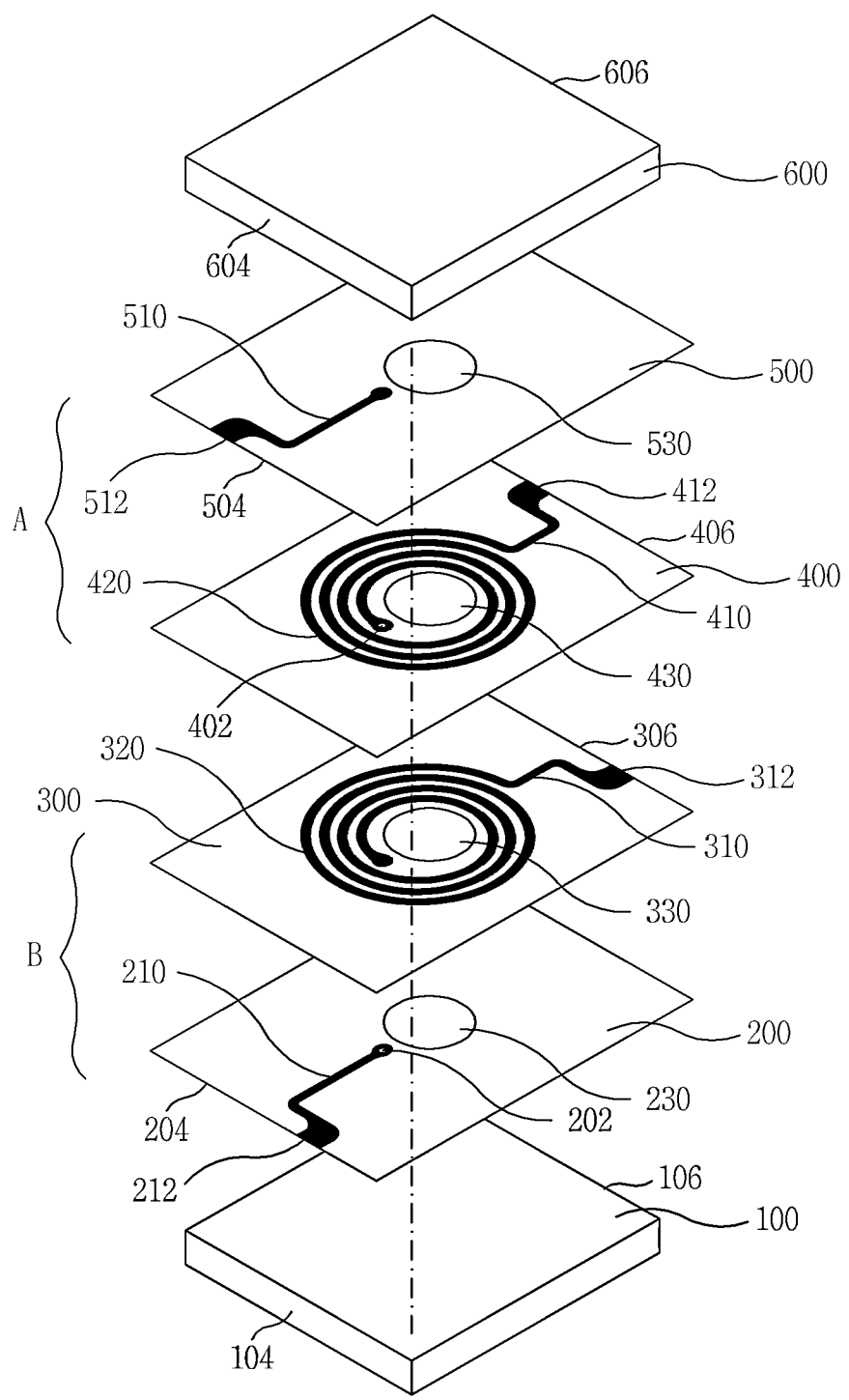
FIG. 6 is an exploded perspective view of the stack type CMF for high frequency according to an embodiment of the present invention.
Figure 7:
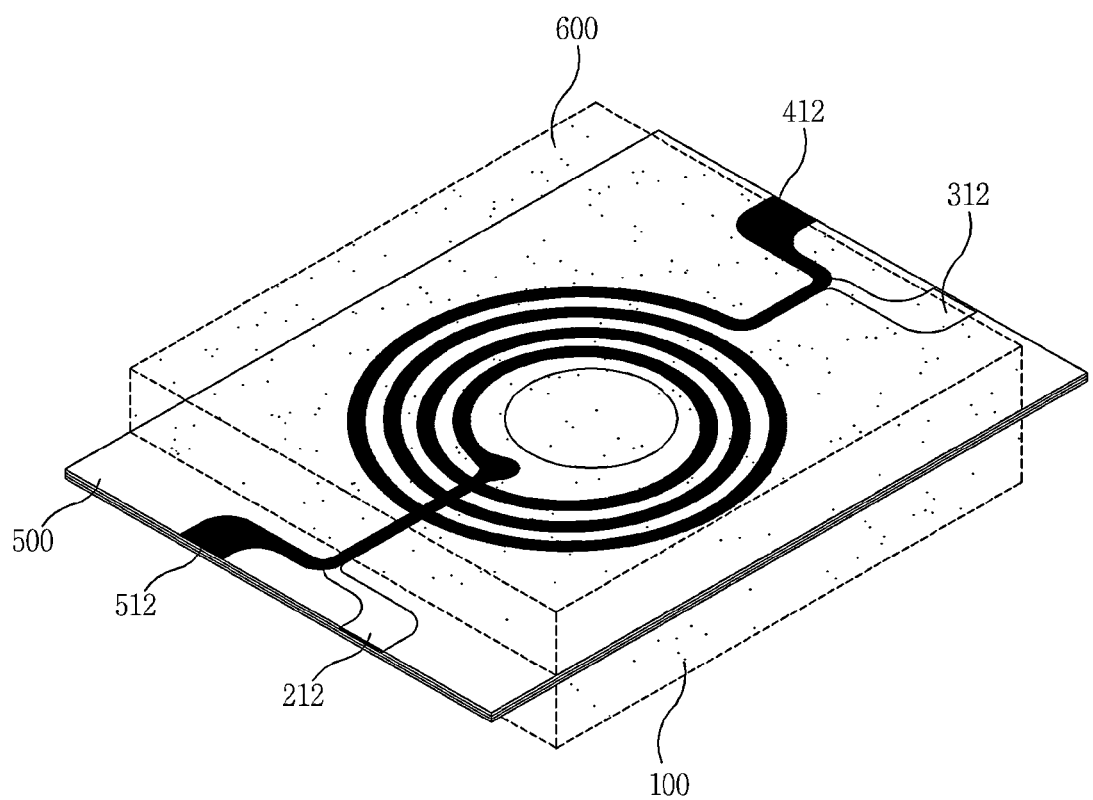
FIG. 7 is a perspective view of the stack type CMF for high frequency according to an embodiment of the present invention.

FIG. 4 is a perspective view of an appearance of a stack type common mode filter (CMF) for high frequency according to an embodiment of the present invention. FIG. 5 is a plan view of the stack type CMF for high frequency according to an embodiment of the present invention. FIG. 6 is an exploded perspective view of the stack type CMF for high frequency according to an embodiment of the present invention. FIG. 7 is a perspective view of the stack type CMF for high frequency according to an embodiment of the present invention.

Referring to FIG. 4, the stack type CMF for high frequency according to an embodiment of the present invention includes a main body 50 and a pair of external electrodes 60 formed on side surfaces of the main body 50 that face each other.

The main body 50 is usually formed of a low temperature co-fired ceramic (LTCC) material, and includes an upper magnetic substance 600, a lower magnetic substance 100, and a stack structure disposed between the upper magnetic substance 600 and the lower magnetic substance 100.

FIG. 6 is an exploded perspective view of the stack structure of the stack type CMF. The stack structure is formed by stacking a pair of unit stack structures A and B in which non-magnetic substances 300 and 400 and non-magnetic substances 200 and 500 are stacked. On the non-magnetic substances 300 and 400, coil patterns 320 and 420 and lead patterns 310 and 410 that are integrally formed with the coil patterns 320 and 420 and electrically connected to the outside are formed. On the non-magnetic substances 200 and 500, lead patterns 210 and 510 electrically connected to the outside are formed so that the non-magnetic substances 200 and 500 are electrically connected to the coil patterns 320 and 420 of the non-magnetic substances 300 and 400.

Portions adjacent to edges of the lead patterns 210, 310, 410, and 510 are bent to respectively form pairs of terminal portions 212, 312, 412, and 512 that are spaced apart from each other. That is, the stack structure including the non-magnetic substances 200, 300, 400, and 500 includes the terminal portions 212, 312, 412, and 512 that are spaced apart from each other on edges of the non-magnetic substances 200, 300, 400, and 500 in opposite directions and are exposed to the outside.

As shown in FIG. 4, the terminal portions 212, 312, 412, and 512 are electrically connected to the external electrodes 60 formed on side surfaces of the main body 50.

Grooves to be filled are formed from a top surface to a bottom surface of the main body 50 to pass through the terminal portions 212, 312, 412, and 512 of the stack structure, are filled with a silver (Ag) paste, and the main body 50 and the stack structure are vertically cut so that the grooves are vertically cut by half, and thus the filled silver paste is exposed to the outside.

The external electrodes 60 are formed on the exposed silver paste, thereby achieving excellent adhesion between the external electrodes 60 and the terminal portions 212, 312, 412, and 512.

Figures 1, 2:
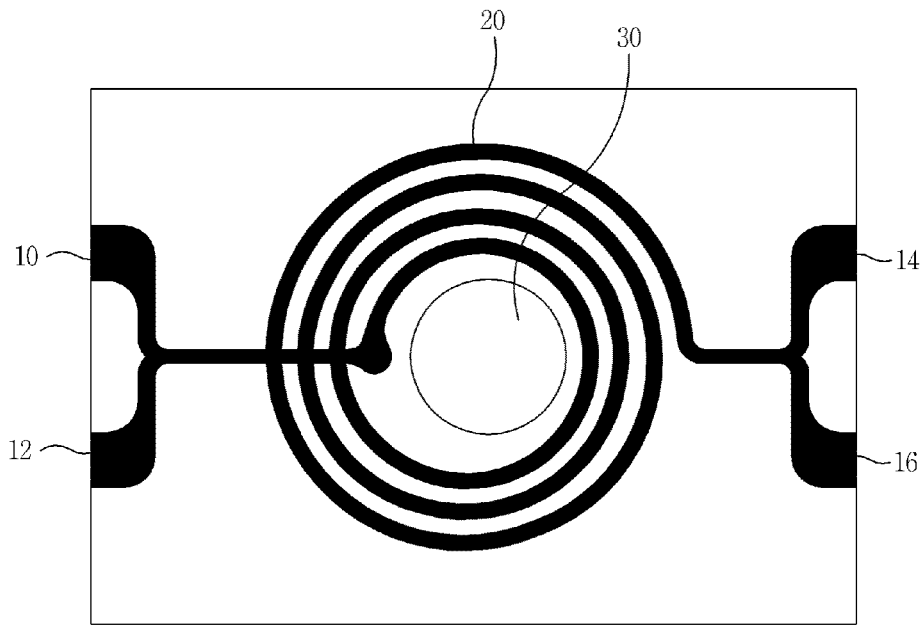
FIG. 1 is a table of conventional effective frequencies for respective signal transmission circuits.
FIG. 2 is a diagram of a conventional common mode filter (CMF)

When the external electrodes 60 are formed as described above, as shown in FIG. 1, the external electrodes 60 may be bent from the non-magnetic substance 200 that is the lowest part of the non-magnetic substances 200, 300, 400, and 500 included in the stack structure to the top surface of the main body 50.

Therefore, a phenomenon in which a point contact is made between external electrodes and conventional terminal portions by covering an Ag paste with a glass component of a main body during a firing process and then the external electrodes and the conventional terminal portions are disconnected in use may be definitely prevented.

Magnetic cores 230, 330, 430, and 530 that are cores of magnetic substances are provided in center parts of the non-magnetic substances 200, 300, 400, and 500, and may be formed by, for example, forming through holes in the center parts and filing and hardening a magnetic paste.

The terminal portion 212 is formed on the non-magnetic substance 200 by extending the lead pattern 220 from a position adjacent to the magnetic core 230 to one side edge 204 and bending the lead pattern 220 to be adjacent to the edge 204.

The coil pattern 320 that is electrically connected to the lead pattern 220 through a via hole 302 formed in a position corresponding to a start position of the non-magnetic substance 200 and is coiled to surround the magnetic core 330 is formed on the non-magnetic substance 300. The terminal portion 312 is formed on the non-magnetic substance 300 by extending the lead pattern 310 integrally formed with the coil pattern 320 to another side edge 306 and bending the lead pattern 310 to be adjacent to the edge 306.

The coil pattern 420 that is coiled to surround the magnetic core 430 in the same turns and direction as those of the coil pattern 320 of the non-magnetic substance 300 is formed on the non-magnetic substance 400. The terminal portion 412 is formed on the non-magnetic substance 400 by extending the lead pattern 410 integrally formed with the coil pattern 420 to another side edge 406 and bending the lead pattern 410 to be adjacent to the edge 406.

In this regard, the terminal portion 412 of the non-magnetic substance 400 is bent in an opposite direction to that of the terminal portion 312 of the non-magnetic substance 300, and thus the terminal portion 412 and the terminal portion 312 are spaced apart from each other by a predetermined space.

The terminal portion 512 is formed by forming a via hole 402 in a start position of the non-magnetic substance 400, electrically connecting the lead pattern 510 of the non-magnetic substance 500 to the coil pattern 420 of the non-magnetic substance 400 through the via hole 402, extending the lead pattern 510 to one side edge 504, and bending the lead pattern 510 to be adjacent to the edge 504.

In this regard, the terminal portion 512 of the non-magnetic substance 500 is bent in an opposite direction to that of the terminal portion 212 of the non-magnetic substance 200, and thus the terminal portion 512 and the terminal portion 212 are spaced apart from each other by a predetermined space.

The non-magnetic substances 200, 300, 400, and 500 may be configured as, for example, green sheets to form the coil patterns 320 and 420 and the lead patterns 210, 310, 410, and 510 thereon. In this connection, since the non-magnetic substances 200, 300, 400, and 500 a structure in which the lead patterns 210, 310, 410, and 510 extend in opposite directions with respect to the coil patterns 320 and 420, the unit stack structures A and B are formed by stacking non-magnetic substances on a single coil pattern, and thus four non-magnetic sheets are necessary.

However, the present invention is not limited thereto. When a polyimide film is applied as a non-magnetic substance, thin film coil patterns and lead patterns are formed on both sides of the polyimide film, and thus two polyimide films may be configured as a stack structure.

Although the terminal portions 212, 312, 412, and 512 are bent to be adjacent to edges in the present embodiment, in each of the terminal portions 212 and 512 and the terminal portions 312 and 412 which extend on the same side surface and make pairs, one terminal portion may extend in a vertical line to the edges without being bent, and spaces between terminal portions may be adjusted by adjusting a length of another terminal portion.

According to the present invention, the terminal portions 212, 312, 412, and 512 that are respectively formed on external terminals of the lead patterns 210, 310, 410, and 510 do not overlap with the upper and lower magnetic substances 600 and 100.

Referring to FIG. 7, in the present embodiment, both edges of the upper and lower magnetic substances 600 and 100 are positioned to be offset inwardly compared to both edges of the non-magnetic substances 200, 300, 400, and 500. In other words, sizes of the upper and lower magnetic substances 600 and 100 may be formed to be smaller than those of the non-magnetic substances 200, 300, 400, and 500.

Thus, as shown in FIGS. 5 and 7, the terminal portions 212, 312, 412, and 512 of the non-magnetic substances 200, 300, 400, and 500 are not covered by the upper and lower magnetic substances 600 and 100 but are exposed to the outside.

The main body 50 is configured as stacked above, and the external electrodes 60 are electrically connected to the terminal portions 212, 312, 412, and 512 exposed in the side surfaces of the main body 50.

According to the above-described structure, as shown in FIG. 5, although there is a difference in distances between the terminal portions 212 and 512 of the non-magnetic substances 200 and 500 and the terminal portions 312 and 412 of the non-magnetic substances 300 and 400 in the common mode, since no magnetic substance does not overlap (stacked) in upper and lower portions, no impedance difference occurs due to the difference in the distances. In the differential mode, no unnecessary parasitic impedance occurs according to the same principle as that in the common mode.

Figure 9A:
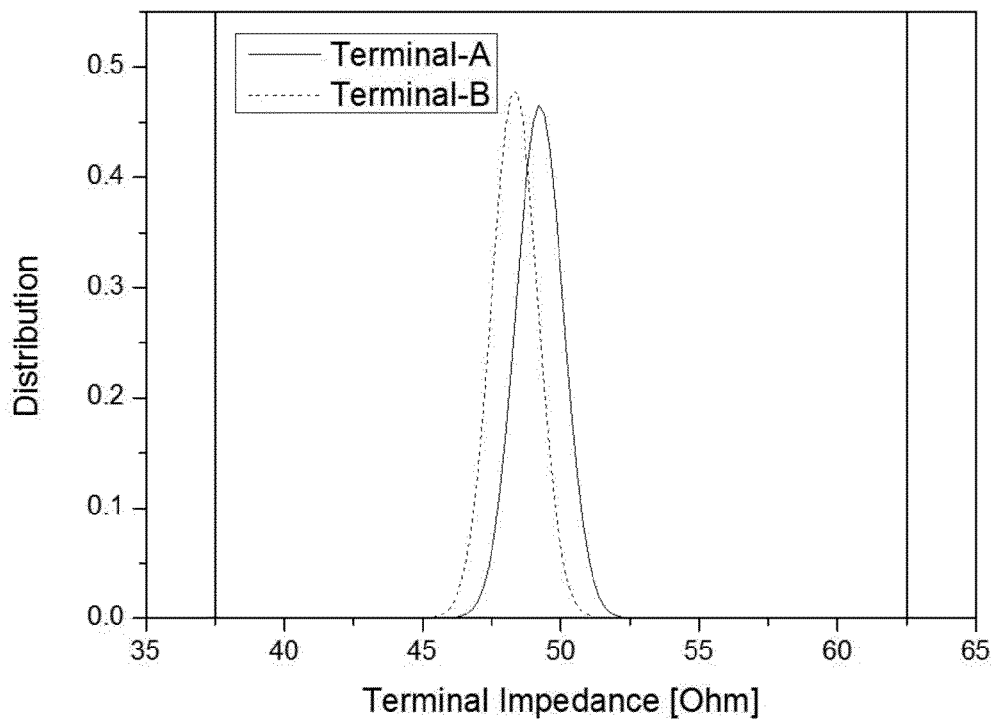
FIG. 9A shows an impedance difference between terminals of the conventional CMF.
Figure 9B:
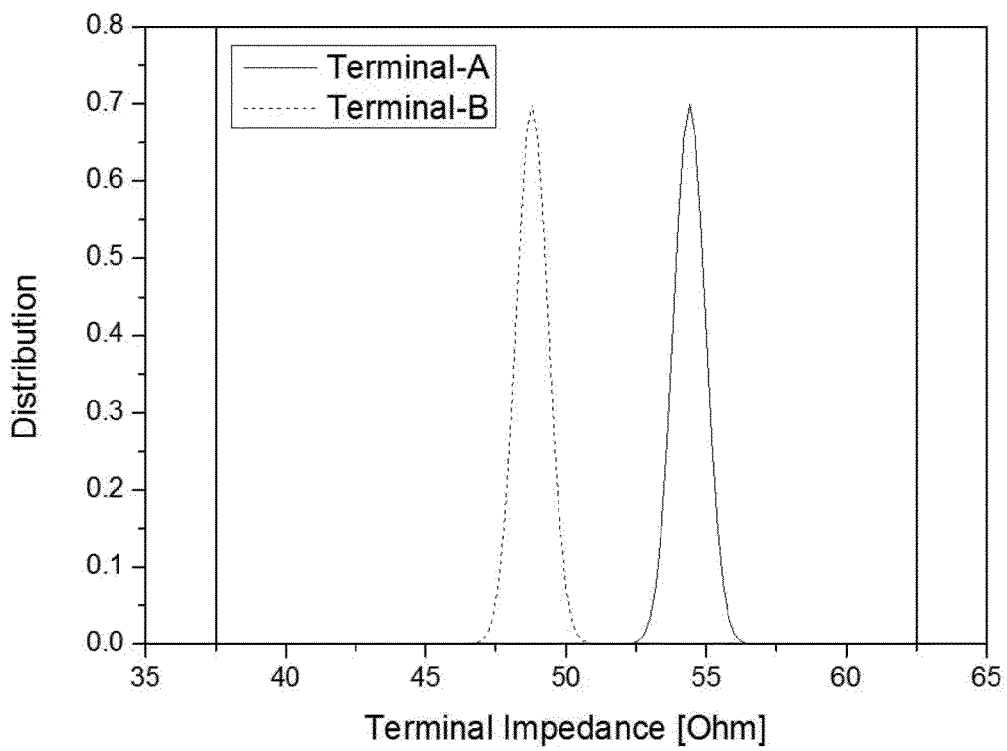
FIG. 9B shows the impedance difference between terminals of the stack type CMF for high frequency according to an embodiment of the present invention.

This is more clearly described with reference to FIGS. 8, 9A and 9B. FIG. 8 is a graph of a frequency characteristic of the stack type CMF for high frequency according to an embodiment of the present invention. FIG. 9A shows an impedance difference between terminals of the conventional CMF, and FIG. 9B shows the impedance difference between terminals of the stack type CMF for high frequency according to an embodiment of the present invention.

Referring to FIG. 8, a red line indicates the frequency characteristic of the stack type CMF for high frequency of the present invention, and a blue line indicates a frequency characteristic of a conventional CMF.

The graph shows that a cut-off frequency defined as attenuation of −3 dB is 7.5 GHz in the conventional CMF, whereas the cut-off frequency has no attenuation of −3 dB in the stack type CMF for high frequency of the present invention.

The graph also shows that the stack type CMF for high frequency of the present invention may have a high cut-off frequency and may be applicable to a high frequency of 3 GHz or higher.

In conclusion, the cut-off frequency may be adjusted to be higher by removing a magnetic substance overlapping with a terminal portion as described in the present invention. That is, the present invention may be applicable to a much higher frequency, and thus the stack type CMF for high frequency may be designed.

FIG. 9A shows an impedance difference between terminals of the conventional CMF, and FIG. 9B shows the impedance difference between terminals of the stack type CMF for high frequency according to an embodiment of the present invention.

According to the graphs, a magnetic substance overlapping with a terminal portion is removed as described in the present invention, thereby greatly improving the impedance difference between terminals.

Figure 10:
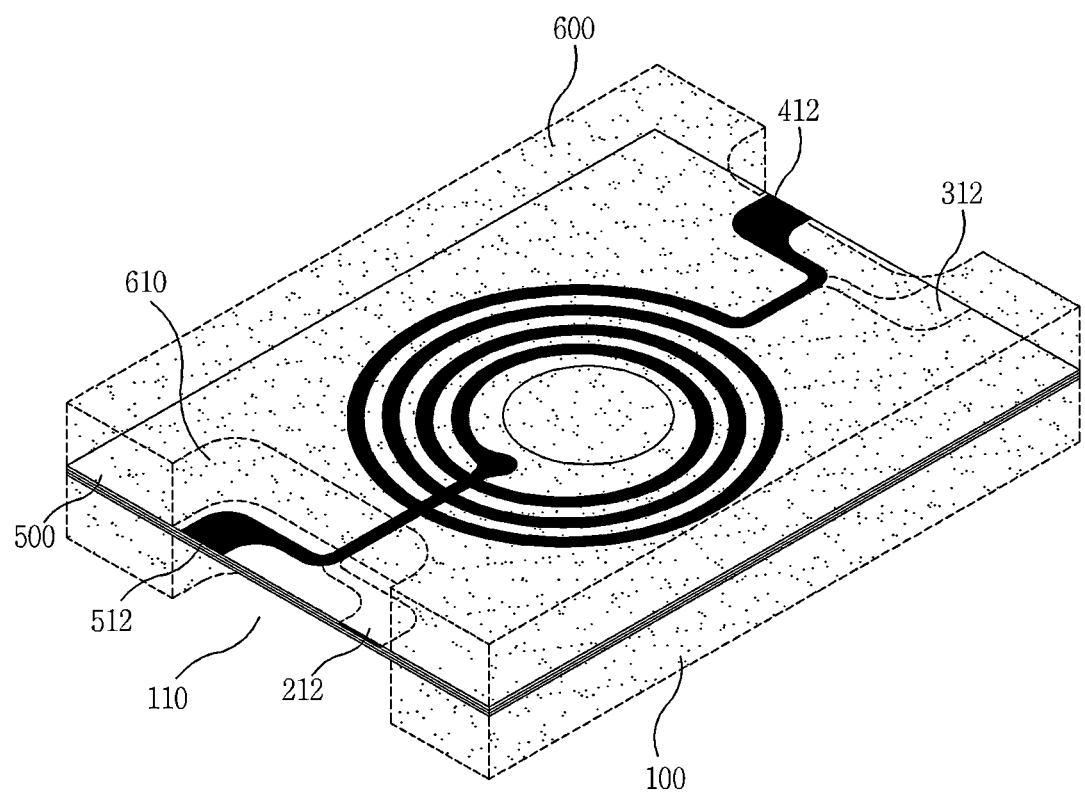
FIG. 10 is a perspective view of a stack type CMF for high frequency according to another embodiment of the present invention.
Figure 11:
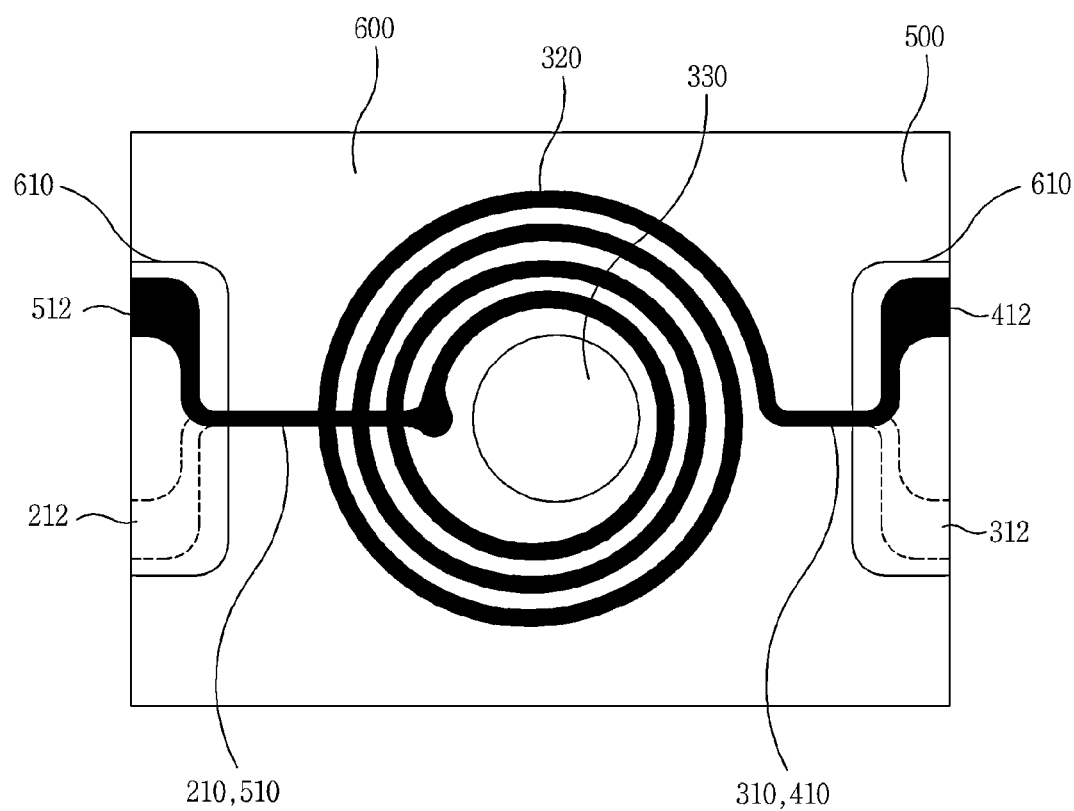
FIG. 11 is a schematic view of the stack type CMF for high frequency according to another embodiment of the present invention.

FIG. 10 is a perspective view of a stack type CMF for high frequency according to another embodiment of the present invention. FIG. 11 is a schematic view of the stack type CMF for high frequency according to another embodiment of the present invention.

In the stack type CMF for high frequency according to the present embodiment, inwardly sunken grooves 110 and 610 are formed in portions respectively corresponding to the pair of terminal portions 212 and 512 of the stack structures 200 and 500 and the pair of terminal portions 312 and 412 of the stack structures 300 and 400 at both edges of the upper and lower magnetic substances 600 and 100 so that the terminal portions 212, 312, 412, and 512 are exposed to the outside.

In other words, portions of both edges of the upper and lower magnetic substances 600 and 100, except for the grooves 110 and 610, are formed to be exactly identical to both edges of each of the non-magnetic substances 200, 300, 400, and 500.

The frequency characteristic and the impedance difference between terminals described with reference to FIGS. 8, 9A and 9B also apply to the present embodiment.

In conclusion, according to the stack type CMF for high frequency as described above, high frequency characteristics may be improved, like removing an impedance difference between terminals, and removing noise in a common mode and removing a signal distortion in a differential mode by removing an unnecessary parasitic impedance from terminal portions, and thus the stack type CMF for high frequency may be applicable at a high frequency compared to a conventional CMF.

While the present invention has been described in detail, it should be understood that various changes, substitutions and alterations can be made hereto without departing from the spirit and scope of the invention as defined by the appended claims.

What is claimed is:

1. A common mode filter (CMF) for high frequency comprising:
   a main body including an upper magnetic substance, a lower magnetic substance, and a stack structure disposed between the upper magnetic substance and the lower magnetic substance, and external electrodes formed on side surfaces of the main body,
   wherein the stack structure is composed of a pair of unit stack structures of a first non-magnetic substance in which coil elements and leads electrically connecting the coil elements to the external electrodes are formed and a second non-magnetic substance on which only leads electrically connected to the external electrodes are formed and electrically connected to the first non-magnetic substance, and
   wherein terminal portions formed at outer ends of the leads do not overlap with the upper magnetic substance and the lower magnetic substance, either by having a length of the upper and lower magnetic substances shorter than that of the first and the second non-magnetic substances, and positioning both opposite ends of the upper and lower magnetic substances to be offset inwardly with respect to both opposite ends of the first and the second non-magnetic substances, or by forming grooves at both opposite ends of the upper and lower magnetic substances, through which grooves the terminal portions of the stack structure are exposed beyond the upper and lower magnetic substances.

2. The CMF for high frequency of claim 1, wherein a terminal portion of one of the unit stack structures has an outwardly bent configuration from the leads, and another terminal portion has a straightly extending configuration from the leads.

3. The CMF for high frequency of claim 1, wherein terminal portions of the unit stack structures have an outwardly bent configuration from the leads.

4. The CMF for high frequency of claim 1, wherein the first non-magnetic substance and the second non-magnetic substance are electrically connected to each other through a via hole.

5. The CMF for high frequency of claim 1, wherein the CMF removes noise in a common mode and removes a signal distortion in a differential mode.

6. The CMF for high frequency of claim 1, wherein the CMF is applicable at a high frequency of 3 GHz or higher by forming a high cut-off frequency.

7. The CMF for high frequency of claim 1, wherein the coil elements and the leads are formed on a green sheet.

8. The CMF for high frequency of claim 1, wherein grooves are formed from a top surface to a bottom surface of the main body to pass through the terminal portions of the stack structure, which grooves are subsequently filled with a silver (Ag) paste, and the main body and the stack structure are vertically cut so that the grooves are vertically cut by half, and thus the external electrodes are formed in the silver paste exposed to the outside.

9. The CMF for high frequency of claim 8, wherein the external electrodes extend to be bent to the top surface of the main body in the middle of a height direction of side surfaces of the main body.

10. A common mode filter (CMF) for high frequency comprising:
    a main body including an upper magnetic substance, a lower magnetic substance, and a stack structure disposed between the upper magnetic substance and the lower magnetic substance, and external electrodes formed on side surfaces of the main body,
    wherein the stack structure is composed of a pair of non-magnetic substances having coil elements and first leads electrically connecting the coil elements to the external electrodes in one surface and second leads electrically connected to the first leads and electrically connected to the external electrodes in another surface, and
    wherein terminal portions formed at outer ends of the first leads and the second leads do not overlap with the upper magnetic substance and the lower magnetic substance, either by having a length of the upper and lower magnetic substances shorter than that of the first and the second non-magnetic substances, and positioning both opposite ends of the upper and lower magnetic substances to be offset inwardly with respect to both opposite ends of the first and the second non-magnetic substances, or by forming grooves at both opposite ends of the upper and lower magnetic substances, through which grooves the terminal portions of the stack structure are exposed beyond the upper and lower magnetic substances.

11. The CMF for high frequency of claim 10, wherein a terminal portion of one of the non-magnetic substances has an outwardly bent configuration from the first leads and the second leads, and another terminal portion has a straightly extending configuration from the first leads and the second leads.

12. The CMF for high frequency of claim 10, wherein terminal portions of the non-magnetic substances have an outwardly bent configuration from the first leads and the second leads.

13. The CMF for high frequency of claim 10, wherein the coil elements and the first leads and the second leads are formed as thin films on a polyimide film.

* * * * *